United States Patent [19]

Gaskill, Jr. et al.

[11] 3,916,215

[45] Oct. 28, 1975

[54] PROGRAMMABLE ECL THRESHOLD LOGIC GATE

[75] Inventors: James R. Gaskill, Jr., Pacific Palisades; Don C. Devendorf, Los Angeles, both of Calif.

[73] Assignee: Hughes Aircraft Company, Culver City, Calif.

[22] Filed: Mar. 11, 1974

[21] Appl. No.: 450,016

[52] U.S. Cl. .................................. 307/203; 307/211

[51] Int. Cl.² .......................................... H03K 19/08

[58] Field of Search ........... 307/211, 213, 215, 218, 307/203; 340/146.2

[56] References Cited

UNITED STATES PATENTS

| | | | |
|---|---|---|---|
| 3,317,753 | 5/1967 | Mayhew | 307/211 |
| 3,573,489 | 4/1971 | Sramek | 307/215 |
| 3,678,292 | 7/1972 | Hampel | 307/211 X |

*Primary Examiner*—John Zazworsky
*Attorney, Agent, or Firm*—Paul H. Ware; W. H. MacAllister

[57] ABSTRACT

A decoupling technique useful in the mechanization of some logic family devices is disclosed. The procedure involves the insertion of a common base transistor between a collector node at which several collectors may be connected and the load resistor for the output device. In general the emitter of the common base decoupling transistor is connected into the collector node and the collector of the common base decoupling transistor is connected to the output load resistor. The impedance thus presented at the collector node by the common base emitter is very much smaller than the load resistance and as a result, the collector time constant becomes relatively insignificant compared with other time constants in the circuit. Practical realization of differential current threshold programming is thus made possible through the implementation of the decoupling techniques of the invention.

1 Claim, 16 Drawing Figures

PROGRAMMABLE ECL THRESHOLD LOGIC GATE

BACKGROUND OF THE INVENTION

1. Field of the Invention

This invention relates generally to logic and programming devices and more particularly to techniques for improving current switch and current switch threshold gate logic circuit speed and for threshold gate threshold-level programming.

2. Description of the Prior Art

Among a number of IC (integrated circuit) families of devices which have been employed in logic systems, is the ECL (emitter-coupled logic) family. Unlike the RTL (resistor-transistor logic), DTL (diode-transistor logic) and TTL (transistor-transistor logic) logic families, to name a few, the ECL family of logic devices does not saturate and thus logic swings are reduced in amplitude. Thus because of the small logic swings and the nonsaturation of the transistors, the logic ECL circuit lends itself to very high speed operation. In addition to providing very high speed operation, ECL exhibits the advantages of high fanout capabilities, very low noise generation, complementary outputs plus the important aspect that outputs can be tied together thereby providing the implied OR function. However, ECL exhibits a basic disadvantage in that heavy capacitive loading at collector nodes causes a slow-down in logic operation. Differential current threshold programming would permit changes in threshold level and hence the logic function performed by a threshold gate. However, when this is implemented without the techniques of the invention, collector node capacitance is increased and transient response is thus degraded thereby causing the change in threshold level to be too slow if high speed circuit operation is important in the application. It would be a great advantage to the art and to the industry if logic operation in ECL could be speeded up in spite of capacitive loading while retaining the basic ECL advantages.

SUMMARY OF THE INVENTION

It is an object of the present invention to provide a technique for improving current switch speed in logic circuits.

Another object of the invention is to improve current switch threshold gate speed.

A further object of this invention is to provide for high speed threshold gate threshold-level programming.

The use of collector wired-logic, i.e. connecting collectors together, either to effect implicit AND formation or for threshold logic, causes the equivalent capacitance of the collectors so wired to become an important factor in the operation of a logic circuit. This collector equivalent capacitance brings about a significant deterioration in the circuit's transient performance. Common base decoupling permits the concurrent high speed operation of a circuit and its incorporation of a large collector wired-logic fan-in. This is the case because with the common base decoupling transistor in place, the impedance presented at the collector node by the common base decoupling transistor's emitter is much smaller than the load resistance. The collector time constant, therefore, becomes less significant when compared with other time constants in the circuit.

Additional objects, advantages and characteristic features of the present invention will become readily apparent from the following detailed description of preferred embodiments of the invention when considered in conjunction with the accompanying drawings.

BRIEF DESCRIPTIONS OF THE DRAWINGS

DETAILED DESCRIPTION

Figure 1:
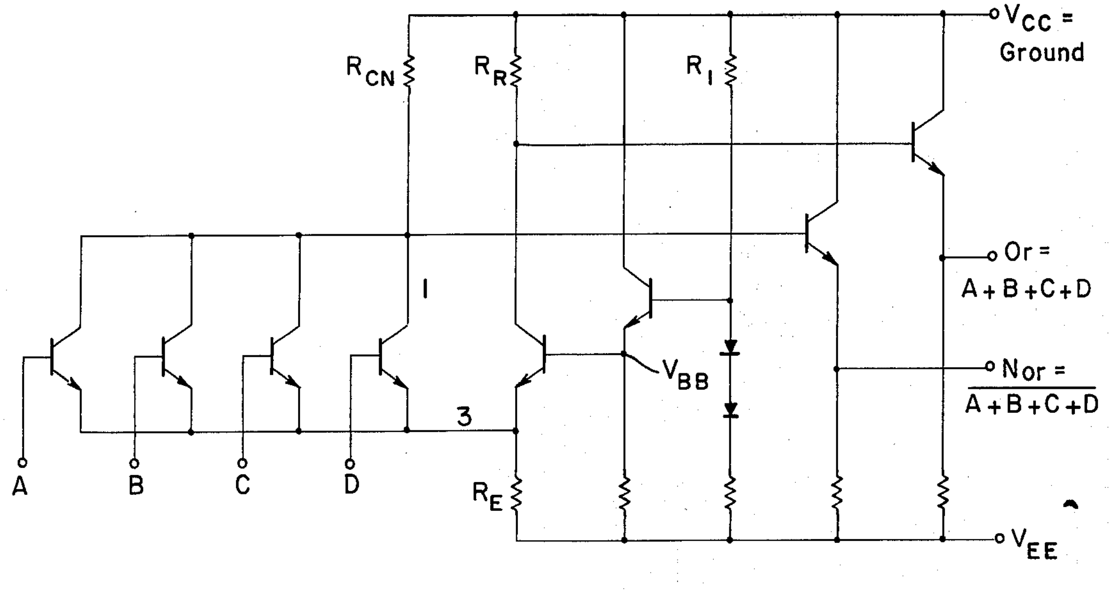
Fig. 1. PRIOR ART
FIG. 1 is a schematic diagram of the basic ECL gate.

Referring to FIG. 1 with greater particularity the basic conventional ECL gate may be analyzed. The schematic of FIG. 1 depicts a four-input OR/NOR gate in which a high level will be assumed at $-v$ and a low level will be assumed at $-V$. If now it is assumed that all inputs are low, no input transistor is conducting and point 3 is at a potential a diode drop below $V_{BB}$ i.e. ($V_{BB}$ −0.75v). Thus the input transistor is OFF and no current flows into point 1, the collector node, through the $R_{CN}$ resistor. The base of the NOR output transistor is thus substantially at ground potential causing its emitter i.e. the output, to be a diode drop lower. The NOR output is then at a potential of about −0.75v. If now at least one of the inputs is caused to see a high level, i.e., $-v$, current will now flow through the $R_{CN}$ resistor causing the base of the NOR output transistor to be below ground by the amount of the IR drop across that resistor. Choosing resistor ratios so that the voltage drop across the $R_{CN}$ resistor is about $p_1$ volts will cause the potential at the NOR emitter follower to be $-p_1 -0.75_v$. Thus, if one or more inputs is high the output is not high and the NOR function is thus described.

Concurrently, when a high voltage $-v$ is incident at one or more of the inputs, current is switched through the $R_{CN}$ resistor and the base of the OR output transistor is substantially ground potential. The emitter, or output of the OR transistor is then at about −0.75 volts. The result then is that if one or more of the inputs is high, the output is high and the OR function is described.

Figure 2:
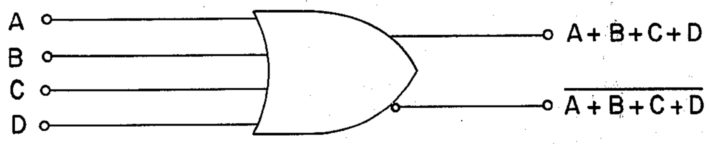
Fig. 2. PRIOR ART
FIG. 2 is a logic symbol for the basic ECL gate shown in FIG. 1.

Referring now to FIG. 2 the basic ECL gate symbol is depicted showing the concurrent OR and NOR outputs therefrom.

Figure 3:
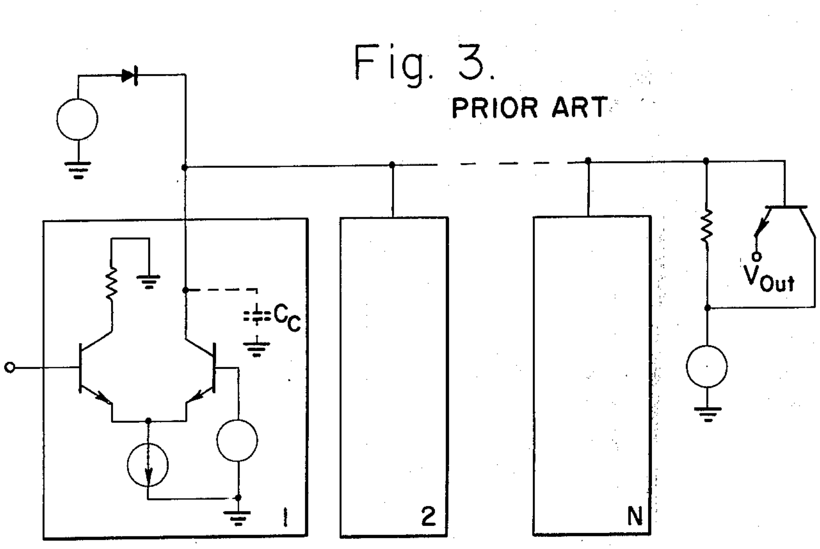
Fig. 3. PRIOR ART
FIG. 3 is a modular drawing showing a representative module exhibiting ECL.

Referring now to FIG. 3, the differential amplifier nature of the input is more readily apparent in the representative module. It is well known in the art that large fanouts are possible if speed is not an important factor. Normally, however speed is of primary consideration and ECL delay time is increased by added capacitance. The collector equivalent capacitance is indicated in the figure as $C_c$.

For ECL circuits, propagation delay is given by:

$$t_{Pd} \doteq t_{Pdo} + .693\, R_L\, \Sigma_K\, C_{ck}$$

where $t_{Pdo}$ = basic current switch delay for zero collector capacitance of the order of $10^{-10}$ second.

$R_L$ = load resistance $C_{ck}$ = $K$th collector equivalent capacitance; of the order of 1 picofarads.

Rise time is given by $$\left(\left[2.2\, R_L \sum_k C_{ck}\right]^2 + T_{RO}^2\right)^{1/2} \doteq 2.2\, R_L \sum_K C_{ck} \qquad (1)$$

whenever $$2.2\, R_L\, \Sigma_K\, C_{CK} >> T_{RO}$$

where $T_{RO}$ = basic current switch rise time; of the order of $10^{-10}$ second.

Connecting the N collectors together, thus forming a collector node as shown in the figure, causes dominance of the collector equivalent capacitance factor resulting in significant deterioration from the circuit's transient performance. Collectors are commonly wired together in order to effect the formation of the IMPLICIT AND function and also for threshold logic purposes. It would be of great utility in improving $t_r$ and $t_{Pd}$ if one of the factors in the RC time constant expression could be minimized.

Figure 4:
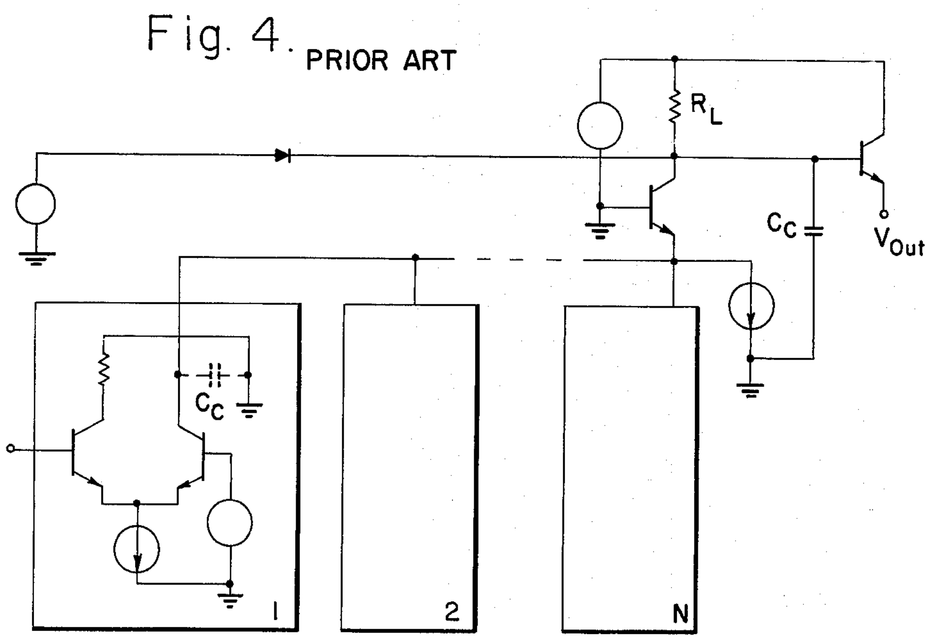
Fig. 4. PRIOR ART
FIG. 4 is a modular drawing showing a representative module exhibiting ECL and further illustrating a method of implementing the common base decoupling technique.

Referring now to FIG. 4 the common base decoupling transistor is shown inserted between the collector node and the load resistor emitter follower output circuit. The collector node now no longer "sees" the comparatively large load resistor but rather looks into the relatively small impedance presented by the common base transistor's emitter. Thus common base decoupling, as illustrated, permits the concurrent high speed operation of an ECL circuit and its incorporation of a large collector wired-logic fan-in. This result is obtained because with the common base decoupling transistor in place, the impedance presented at the collector node by the common base transistor's emitter is very small compared to the load resistance. Consequently the collector time constant becomes relatively insignificant when compared with other time constants in the circuit.

Figure 5:
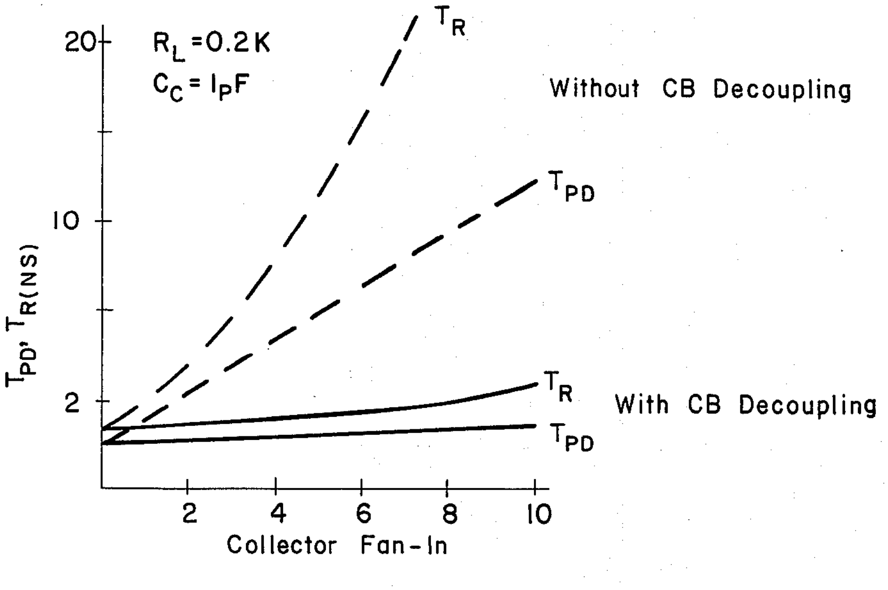
Fig. 5. PRIOR ART
FIG. 5 is a graph illustrating the improvement in execution time realized in ECL circuits using the common base decoupling technique. The effects of collector fan-in are shown for systems without and with common base decoupling.

Reference to FIG. 5 allows comparison between propagation delay and rise time without the advantages of the invention to the same functions when the common base decoupling of the invention is utilized. It is to be noted that with increasing collector fan-in, the improvement in $t_r$ (rise time) and $t_{Pd}$ (propagation delay) is at least an order of magnitude.

Figure 6:
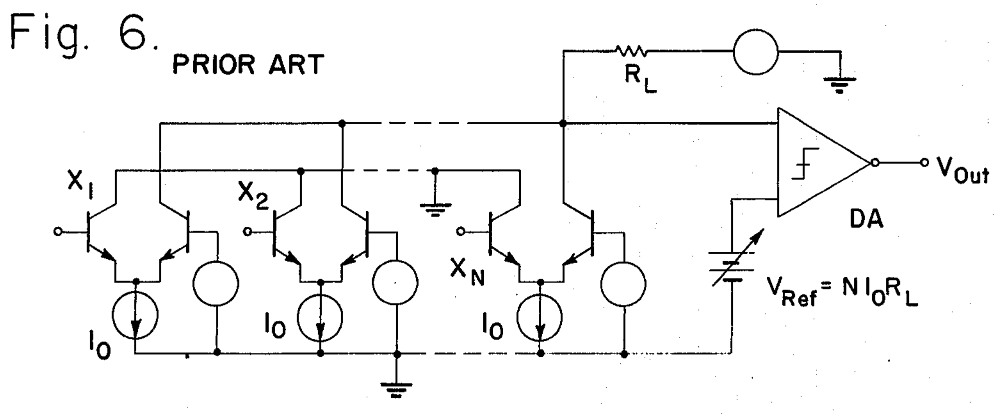
Fig. 6. PRIOR ART
FIG. 6 is a schematic diagram illustrating the circuit interconnections in the basic ECL Programmable Threshold Gate.

Referring now to FIG. 6, the basic ECL Programmable Threshold Gate is shown. It will be observed that for each of several discrete value adjustments of the reference voltage $V_{REF}$ fed to the comparator DA there is a resultant change in the number of true input signals required prior to the execution of a logic transition at the output of the comparator.

Figure 7:
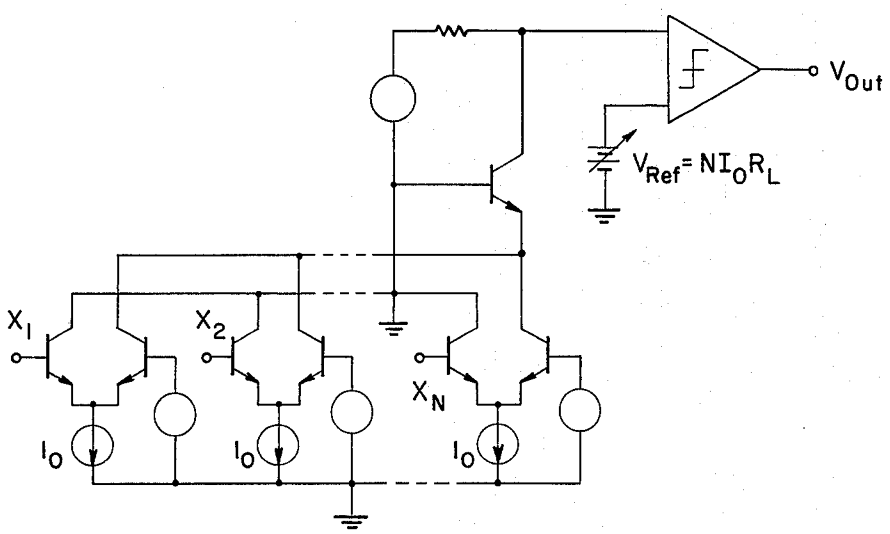
Fig. 7. PRIOR ART
FIG. 7 is a schematic diagram illustrating the circuit interconnections in the basic ECL Programmable Threshold Gate and showing the implementation of common base decoupling therein.

FIG. 7 depicts an embodiment of a Programmable Differential Threshold Gate. Because of the implementation of common base decoupling, this circuit effects the high speed changing of threshold level and hence the logic function performed by the gate.

Figure 8:
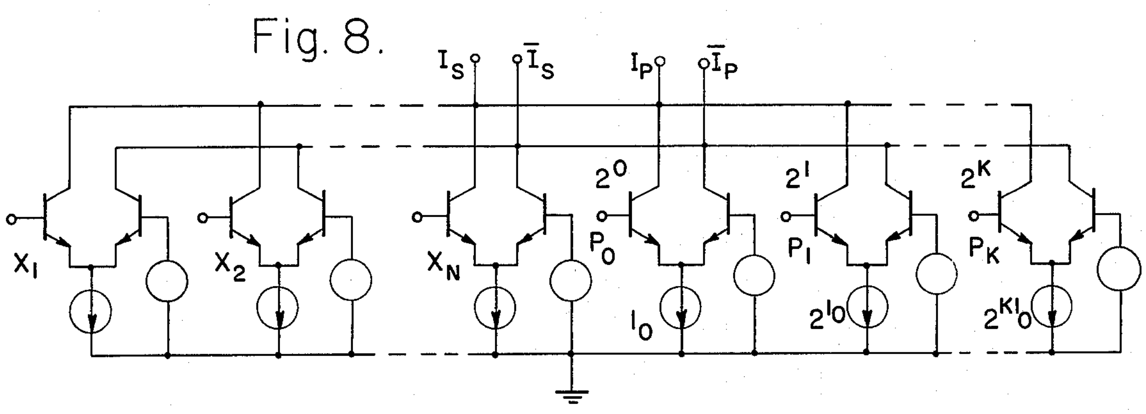
FIG. 8 is a schematic diagram of the Programmable Differential Threshold Gate circuit of the invention.

Referring now to FIG. 8 the basic ECL Programmable Differential Threshold Gate is depicted. Understanding of the operation is greatly facilitated by considering the circuit in parts. Considering first the differential threshold gates comprising a plurality of electronic circuits having inputs $X_1$ through $X_n$ independently of the programming circuit comprising a plurality of electronic circuits having inputs $P_o$ through $P_k$, it will be observed that the output changes state whenever the threshold is attained via inputs $X_1$ through $X_n$.

Figure 9:
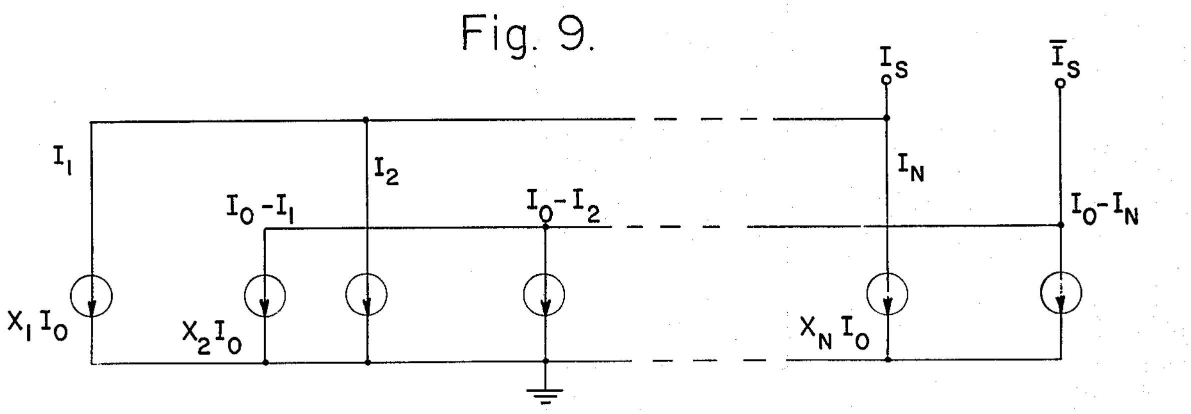
FIG. 9 is an equivalent circuit construct of the input gates of FIG. 8.

FIG. 9 depicts an equivalent circuit reduction of the differential threshold gates of FIG. 8. It is to be understood that the output function is sgn X where $$\operatorname{sgn} X = \begin{matrix} 1 \text{ if } X > 0 \\ 0 \text{ if } X < 0 \end{matrix}$$

Input and output functions to be defined presently have been indicated on the figure.

Figures 10, 12:
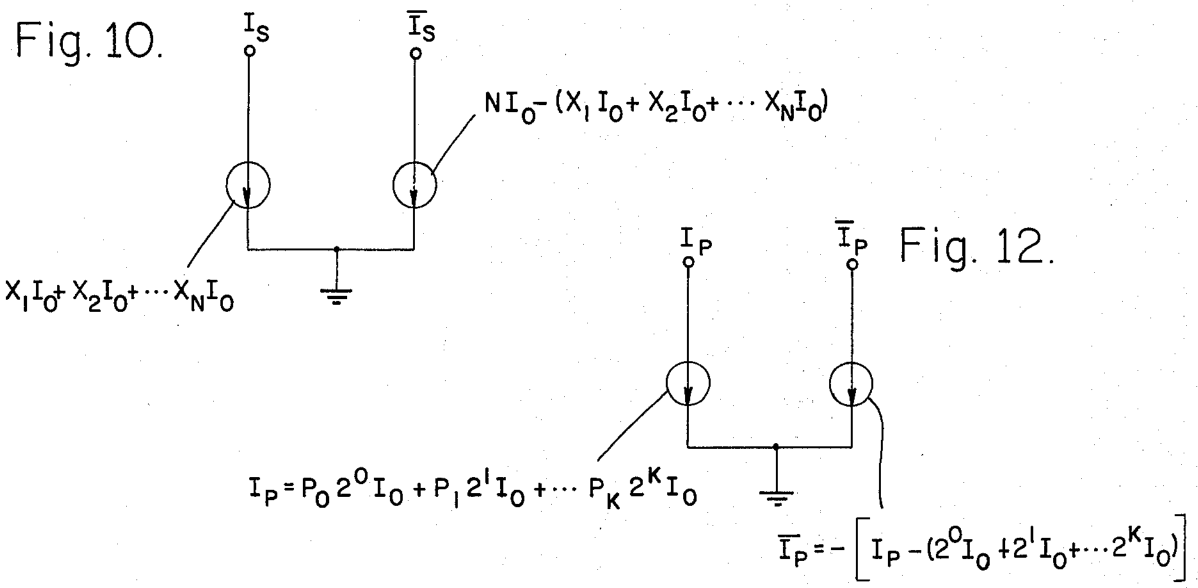
FIG. 10 is a further equivalent circuit simplification of FIG. 9.
FIG. 12 is a further equivalent circuit simplification of FIG. 11.

FIG. 10 effects a further equivalent circuit simplification of FIG. 9. The input and output functions are further defined. It should be remembered that $X_i$ is equal to one or zero in accordance with the above connection.

Figure 11:
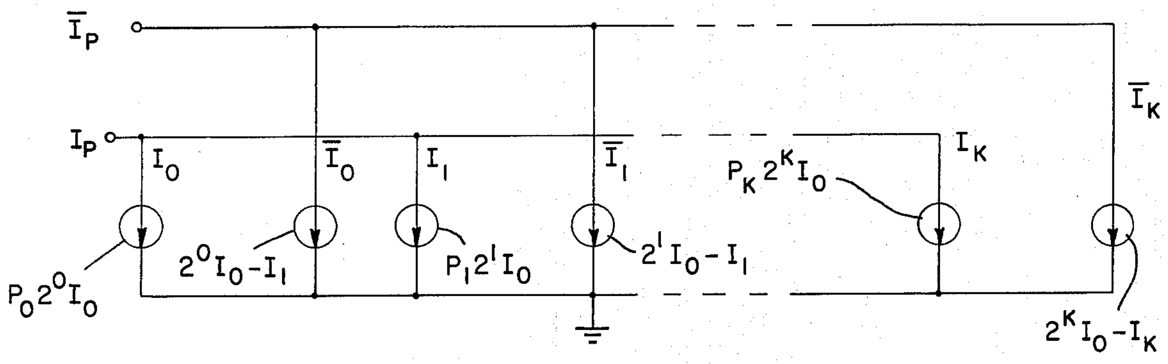
FIG. 11 is an equivalent circuit construct of the programming gates of FIG. 8.

FIG. 11 depicts an equivalent circuit reduction of the Programming Circuit of FIG. 8. Input and output functions, also to be defined presently are indicated in the figure.

FIG. 12 effects a further equivalent circuit simplification of FIG. 11. The input and output functions are further defined for the current sources illustrated.

Figure 13:
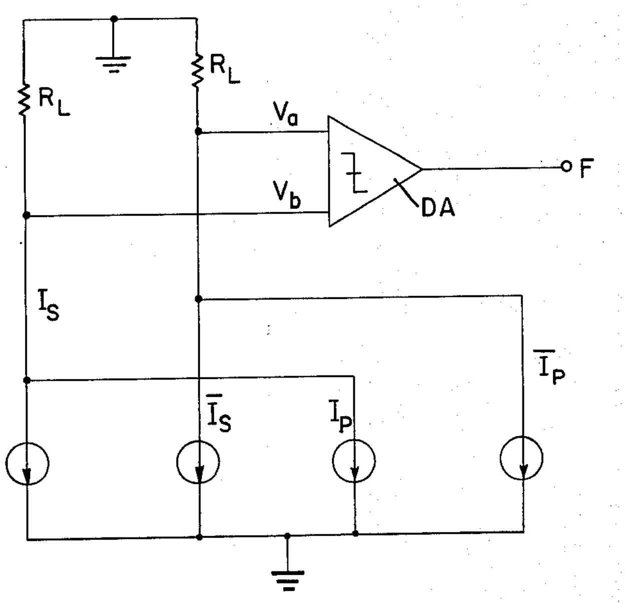
FIG. 13 is a resultant equivalent circuit construction for a programmable differential threshold gate circuit.

FIG. 13 depicts the interconnection of the reduced equivalent circuits of FIGS. 10 and 12 as utilized in an implementation of a programmable differential threshold gate circuit.

Figure 14:
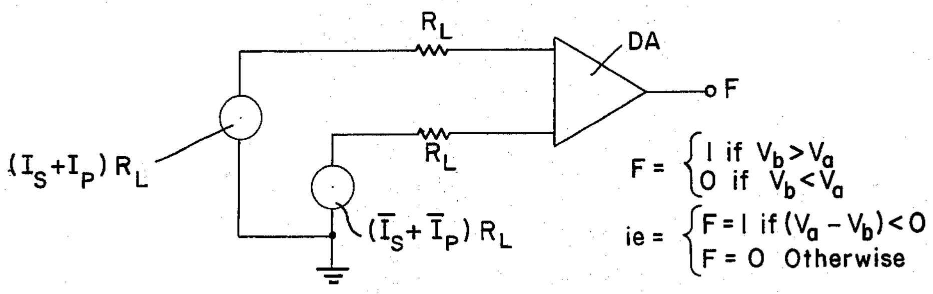
FIG. 14 is a further equivalent circuit simplification of FIG. 13.

FIG. 14 effects a further equivalent circuit reduction of FIG. 13. The output F is defined in terms of the logic states assumed. The inputs are defined in terms of equivalent voltages.

It is necessary to define the inputs to the amplifier DA. From FIG. 10 it may be seen that $I_s$ may be written.

$N$

-Continued $$I_s = I_o \sum_{j=1} X_j \quad (2)$$

and $\overline{I_s}$ may be written:

$$\overline{I_s} = I_o \left( N - \sum_{j=1}^{N} X_j \right) \quad (3)$$

Further, from FIG. 12 we may write:

$$\overline{I_p} = I_o \sum_{l=0}^{K} P_l 2^l \quad (4)$$

and $$\overline{I_p} = I_o \left[ \sum_{l=1}^{K} (1-P_l)2^l \right] \quad (5)$$

In order for the F output to attain a logical 1 state it is necessary that $$R_L I_o \left\{ \left( \sum_{j=1}^{N} X_j + \sum_{l=0}^{K} P_l 2^l \right) - \left[ \left( N - \sum_{j=1}^{N} X_j \right) + \sum_{l=0}^{K} (1-P_l)2^l \right] \right\} > 0 \quad (6)$$

it is obvious that the factor $R_L I_o$ goes to magnitude and the sign of the function depends upon the term enclosed in the braces.

Consider an example in which the number of differential inputs is 8, that is, N 32 8 and the number of programmed inputs is 2, that is K = 2. We have, for the term within the braces:

$$\sum_{j=1}^{8} X_j + \sum_{l=0}^{2} P_l 2^l \left[ 8 - \sum_{j=1}^{8} X_j + \sum_{l=0}^{2} (1-P_l)2^l \right] \quad (7)$$

The last term in the bracket may be rewritten as:

$$\sum_{l=0}^{2} 2^l - \sum_{l=0}^{2} P_l 2^l \quad (8)$$

so we have:

$$\sum_{j=1}^{8} X_j + \sum_{l=0}^{2} P_l 2^l - 8 + \sum_{j=1}^{8} X_j - \sum_{l=0}^{2} 2^l + \sum_{l=0}^{2} P_l 2^l \quad (9)$$

Now, $$\sum_{l=0}^{2} 2^l = 2^0 + 2^1 + 2^2 = 7 \quad (10)$$

so, that, collecting terms, we have:

$$2 \left( \sum_{j=1}^{8} X_j + \sum_{l=0}^{2} P_l 2^l \right) - (8+7) > 0 \longleftrightarrow F=1 \quad (11)$$

or $$\sum_{j=1}^{8} X_j + \sum_{l=0}^{2} P_l 2^l - 7.5 > 0 \longleftrightarrow F=1 \quad (12)$$

Figure 15:
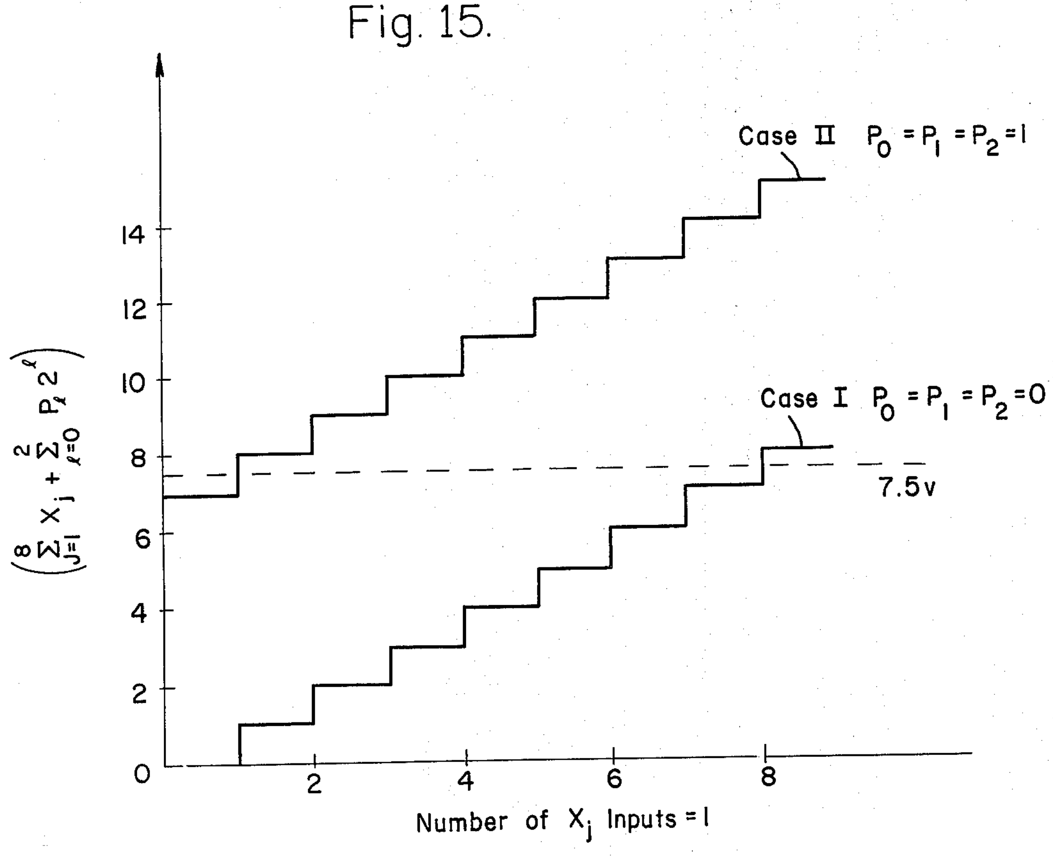
FIG. 15 is a useful aid in the form of a graph, helpful in the understanding of the Programmable Differential Threshold Gate circuit of the invention.

In order to illustrate the resultant significant consequences, it will be helpful to consider the following two limiting cases. The diagram shown in FIG. 15 will be of aid in the visualization of the operation thus described. It will first be observed that since $P_0$, $P_1$, $P_2$ can each be 1 or 0 independently, therefore the term $$\sum_{l=0}^{2} P_l 2^l \quad (13)$$

will assume any integral value between 0 and 7, that is: when all $P_l = 0$, the lower staircase function follows the number of true $X_j$ inputs. On the other hand if all $P_l = 1$, the upper staircase function follows the number of true $X_j$ inputs. All other permutations of $P_0$, $P_1$, $P_2$ inputs generate staircase functions between the two extremes shown. Thus through appropriate choice of the program control vector, in this instance $P_0$, $P_1$, $P_2$, the circuit threshold can be programmed. At one extreme, an integral requirement value of all 8 $X_j$; inputs TRUE will cause the circuit to switch. This extreme is illustrated by the lower staircase function in FIG. 15. At the other extreme just one $X_j$ input causes the circuit to switch as illustrated by the staircase function in the upper part of FIG. 15.

The problem remaining in order to ensure the practicability of operation of the Programmable Differential Threshold Gate so described is in its speed of execution. It will be noted upon referring to FIG. 8 that the collectors of the gates are wired together thus causing the dominance of the capacitive loading and causing the collector nodes thus formed to "see" the load resistors $R_L$. As noted hereinbefore, circuit time constant is thus degraded by the inherent characteristic that heavy capacitive loading slows down the operation of ECL circuits.

Figure 16:
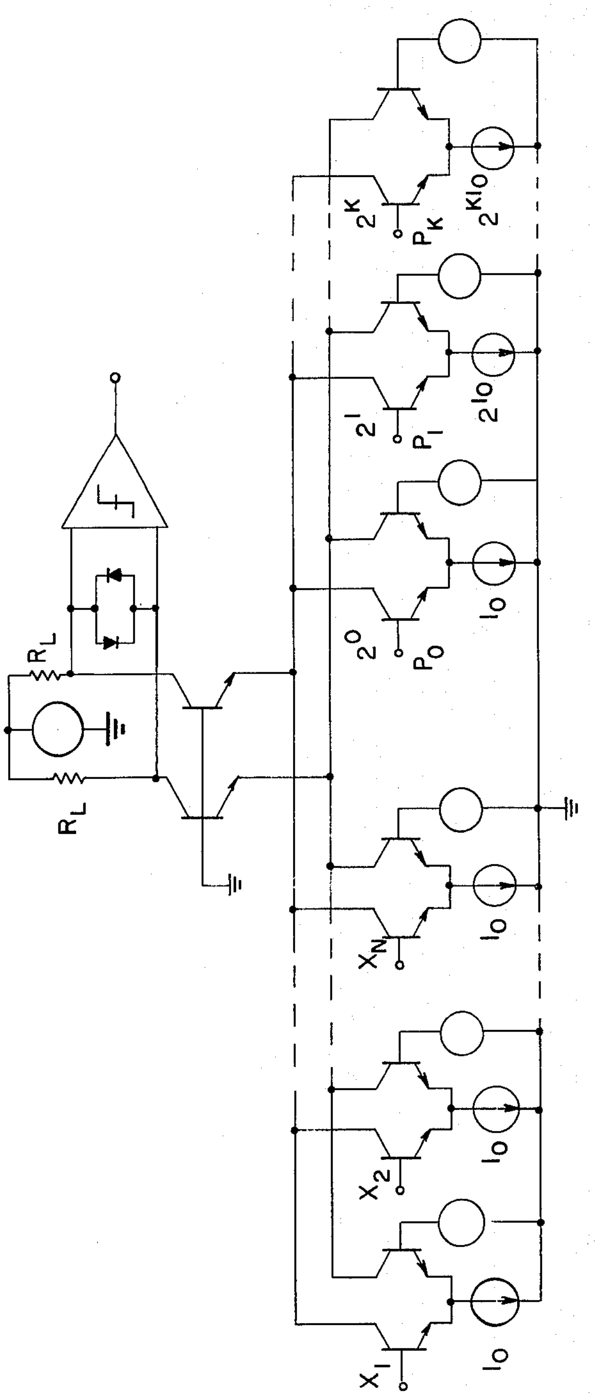
FIG. 16 is a schematic diagram of the Programmable Differential Threshold Gate circuit of the invention and illustrating the implementation of the common base decoupling technique.

Referring to FIG. 16, it will be observed that common base decoupling has been employed in conjunction with the Programmable Differential Threshold Gate. Rapid operation is thus effected as indicated by the curves of FIG. 5.

Thus, there has been described a Programmable Differential Threshold Gate that operates at speeds rapid enough to ensure the practicability of such a device. Thus high speed change of threshold level, as described above, varies the logic function performed by the threshold gate through variation of the programming vector. The execution speeds attained are made possible through the techniques of common base decoupling as described herein.

It is pointed out that although the present invention has been shown and described with reference to particular embodiments, nevertheless various changes and modifications obvious to one skilled in the art to which the invention pertains are deemed to lie within the purview of the invention.

What is claimed is:

1. An emitter coupled logic threshold gate comprising a first plurality of electronic circuits each having first and second transistors electrically interconnected at their emitter elements to a current reference point, said first transistors having an input terminal connected to each base thereof and having each collector thereof connected to a first collector node, said second transistors having a voltage reference point connected at each base thereof and having each collector thereof connected to a second collector node;

first and second transistor amplifiers, each connected in a common base configuration with their bases connected to a reference potential, their emitters connected respectively to said first and second collector nodes and their collectors connected respectively to a first end of first and second load resistors, said load resistors having their second ends connected in common to a voltage reference point;

a digital differential comparator amplifier having first and second input points and an output point, wherein said first input point is connected to the junction of said first end of said first load resistor and the collector of said first transistor amplifier and said second input point is connected to the junction of said first end of said second load resistor and the collector of said second transistor amplifier, said output point of said digital differential comparator amplifier providing an indication of the logic state of the emitter coupled logic threshold gate;

a second plurality of electronic circuits, each having first and second transistors electrically interconnected at their emitter elements to a current reference point, said first transistors having an input terminal connected to each base thereof and having each collector thereof connected to said first collector node, said second transistors having a voltage reference point connected to each base thereof and having each collector thereof connected to said second collector node.

* * * * *